(12) United States Patent
Yu et al.

(10) Patent No.: US 9,553,070 B2
(45) Date of Patent: Jan. 24, 2017

(54) 3D PACKAGES AND METHODS FOR FORMING THE SAME

(71) Applicant: Taiwan Semiconductor Manufacturing Company, Ltd., Hsin-Chu (TW)

(72) Inventors: Chen-Hua Yu, Hsin-Chu (TW); Der-Chyang Yeh, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 207 days.

(21) Appl. No.: 14/265,278

(22) Filed: Apr. 29, 2014

(65) Prior Publication Data

US 2014/0319696 A1 Oct. 30, 2014

Related U.S. Application Data

(60) Provisional application No. 61/817,699, filed on Apr. 30, 2013.

(51) Int. Cl.
*H01L 21/58* (2006.01)
*H01L 25/10* (2006.01)
*H01L 23/00* (2006.01)

(52) U.S. Cl.
CPC ............ *H01L 24/96* (2013.01); *H01L 24/19* (2013.01); *H01L 24/20* (2013.01); *H01L 24/97* (2013.01); *H01L 24/48* (2013.01); *H01L 24/73* (2013.01); *H01L 24/94* (2013.01); *H01L 2224/12105* (2013.01); *H01L 2224/16225* (2013.01); *H01L 2224/32145* (2013.01); *H01L 2224/32225* (2013.01); *H01L 2224/48227* (2013.01); *H01L 2224/73265* (2013.01); *H01L 2224/82001* (2013.01); *H01L 2224/97* (2013.01); *H01L 2225/0651* (2013.01); *H01L 2225/06568* (2013.01); *H01L 2225/1035* (2013.01); *H01L 2225/1058* (2013.01); *H01L 2924/00014* (2013.01); *H01L 2924/12042* (2013.01); *H01L 2924/1461* (2013.01); *H01L 2924/15311* (2013.01); *H01L 2924/15331* (2013.01);

(Continued)

(58) Field of Classification Search
USPC .................................. 438/109; 257/E25.018
IPC ....................... H01L 2224/19,2224/94, 2224/97
See application file for complete search history.

(56) References Cited

U.S. PATENT DOCUMENTS

| 2011/0115070 A1* | 5/2011 | Lim ...................... H01L 21/563 257/698 |
| 2011/0210444 A1* | 9/2011 | Jeng ........................ H01L 23/13 257/738 |

(Continued)

*Primary Examiner* — Marcos D Pizarro
(74) *Attorney, Agent, or Firm* — Slater Matsil, LLP

(57) ABSTRACT

Embodiments of the present disclosure include a semiconductor device, a package, and methods of forming a semiconductor device and a package. An embodiment is a method including placing a plurality of dies over a passivation layer, the plurality of dies comprising at least one active device, molding the plurality of dies with a first molding material, and forming a plurality of through-package vias (TPVs) in the first molding material, first surfaces of the plurality of TPVs being substantially coplanar with a backside surfaces of the plurality of dies. The method further includes patterning the passivation layer to expose a portion of the first surfaces of the plurality of TPVs, and bonding a plurality of top packages to the first surfaces of the plurality of TPVs.

20 Claims, 8 Drawing Sheets

(52) U.S. Cl.
CPC .................. *H01L 2924/181* (2013.01); *H01L 2924/18161* (2013.01)

(56) References Cited

U.S. PATENT DOCUMENTS

| | | | |
|---|---|---|---|
| 2011/0278736 A1* | 11/2011 | Lin | H01L 25/50 257/774 |
| 2012/0238057 A1* | 9/2012 | Hu | H01L 21/486 438/107 |
| 2012/0305916 A1* | 12/2012 | Liu | H01L 22/34 257/48 |
| 2013/0175702 A1* | 7/2013 | Choi | H01L 23/481 257/774 |
| 2013/0277841 A1* | 10/2013 | Lii | H01L 25/105 257/741 |
| 2014/0264817 A1* | 9/2014 | Lee | H01L 25/0657 257/712 |

* cited by examiner

3D PACKAGES AND METHODS FOR FORMING THE SAME

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. In addition, when more devices are put into one chip or die, more complex designs are required.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
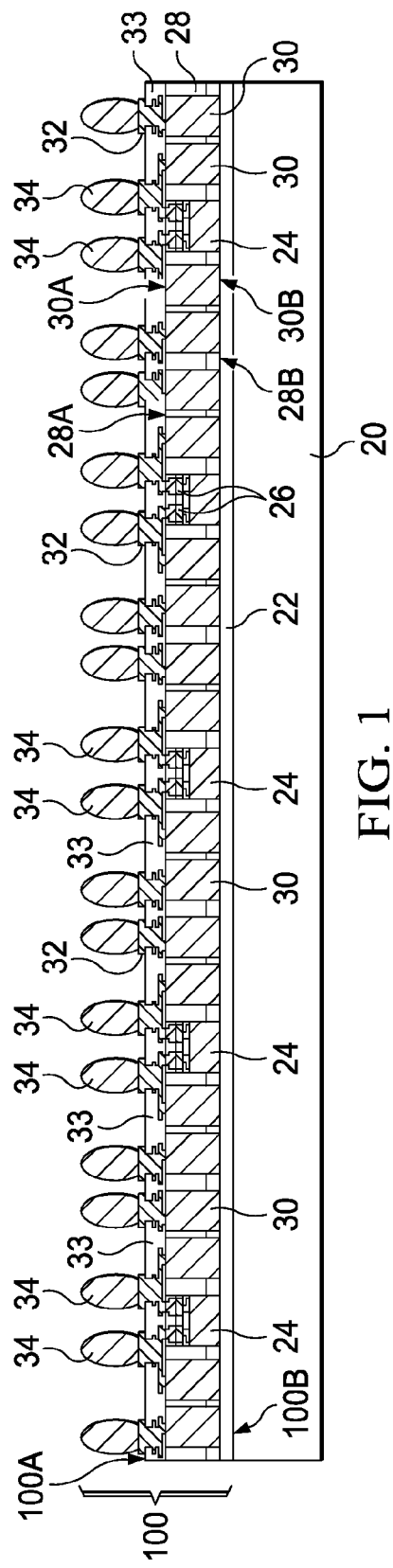
FIGS. 1 through 7 illustrate intermediate stages of forming a semiconductor device according to an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a method of forming a package on wafer semiconductor device. Other embodiments may also be applied, however, to other package structure configurations.

Figure 6:
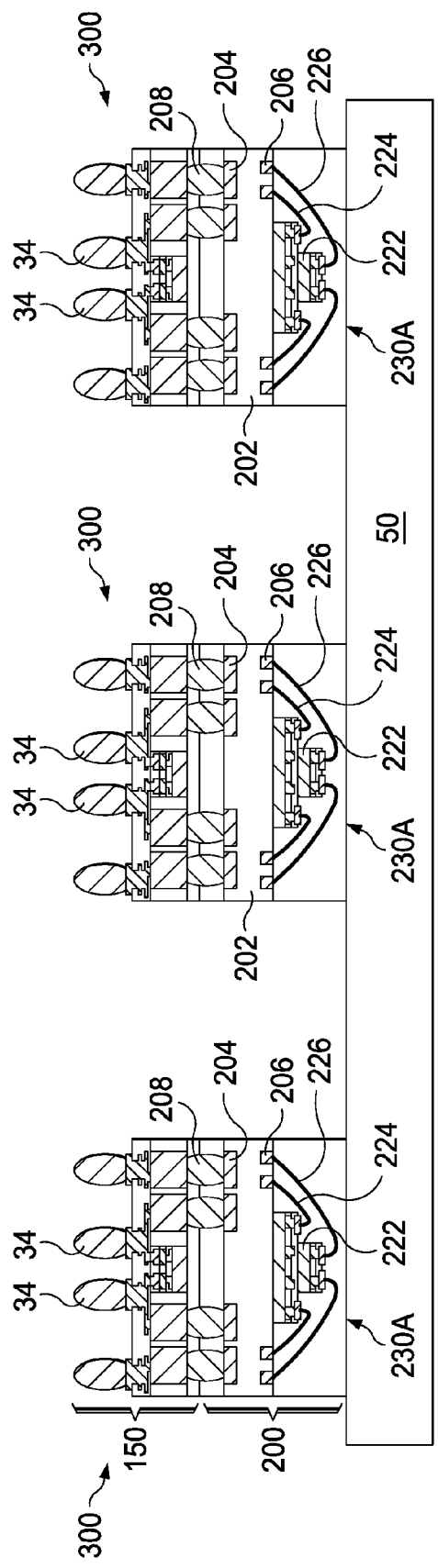
Figure 7:
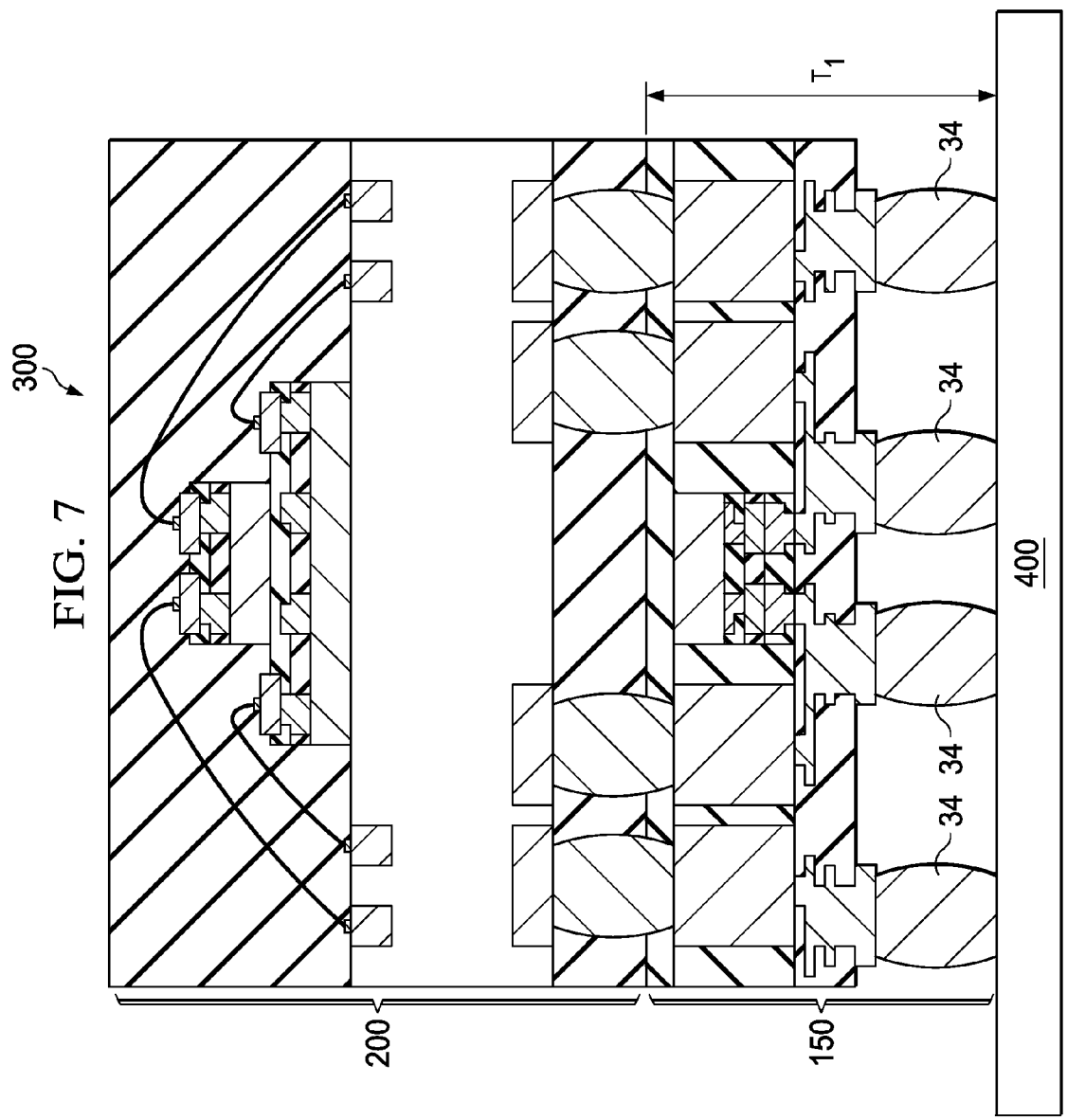
Figure 8:
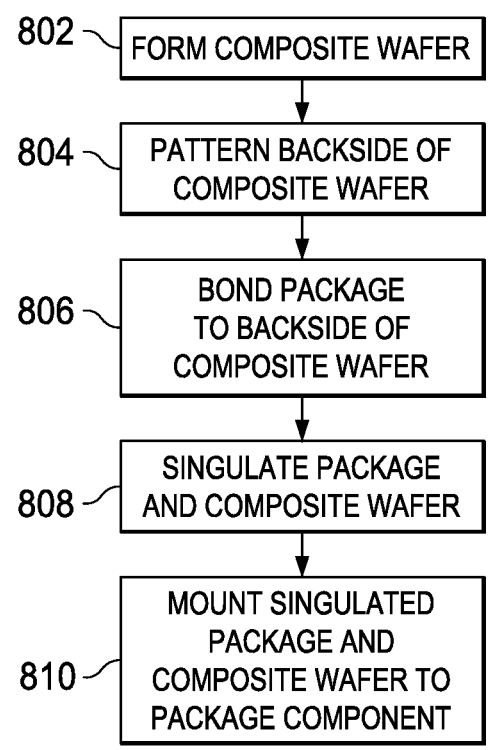
FIG. 8 illustrates a process flow of the process illustrated in FIGS. 1 through 7 according to an embodiment.

FIGS. 1 through 7 are cross-sectional views of intermediate stages in the manufacturing of a semiconductor device according to an embodiment, and FIG. 8 is a process flow of the process shown in FIGS. 1 through 7.

FIG. 1 illustrates the formation of a composite wafer 100 (step 802) a backside passivation layer 22, dies 24, die bonding structure 26, molding material 28, conductive posts 30, redistribution lines (RDLs) 32 in dielectric layers 33, and connectors 34. The composite wafer 100 is over a carrier 20. The carrier 20 may be any suitable substrate that provides (during intermediary operations of the fabrication process) mechanical support for the layers on top. The carrier 20 may be a wafer including glass, silicon (e.g., a silicon wafer), silicon oxide, metal plate, a ceramic material, or the like.

The backside passivation layer 22 may be formed on the carrier 20. The backside passivation layer 22 can be silicon nitride, silicon carbide, silicon oxide, low-k dielectrics such as carbon doped oxides, extremely low-k dielectrics such as porous carbon doped silicon dioxide, a polymer, such as an epoxy, polyimide, benzocyclobutene (BCB), polybenzoxazole (PBO), the like, or a combination thereof, although other relatively soft, often organic, dielectric materials can also be used, and deposited by chemical vapor deposition (CVD), physical vapor deposition (PVD), atomic layer deposition (ALD), a spin-on-dielectric process, the like, or a combination thereof. In some embodiments, there is an adhesive layer (not shown) used for attaching the backside passivation layer 22 to the carrier 20. The adhesive layer may be formed of, for example, an Ultra-Violet (UV) glue.

The dies 24 may be placed on the backside passivation layer 22. The dies 24 are placed with the back surfaces facing the backside passivation layer 22, and hence the back surfaces of the dies 24 are coplanar with each other. The dies 24 may be device dies having integrated circuit devices, such as transistors, capacitors, inductors, resistors (not shown), and the like, therein. Further, the dies 24 may be logic dies having core circuits, and may be, for example, a central processing unit (CPU) die. In some embodiments, the dies 24 are multiple stacked dies, for example, a memory stacking.

The dies 24 may have die bonding structures 26 formed as the top portions of the dies 24, and are electrically coupled to the devices in the dies 24. The bonding structures 26 may include metal bumps, metal lines, dielectric layers, the like, or a combination thereof. Throughout the description, the surfaces of the dies 24 with the bonding structures 26 are referred to as the active surfaces.

After the dies are placed, molding material 28 is molded on and around dies 24. The molding material 28 fills the gaps between dies 24, and may be in contact with backside passivation layer 22. Furthermore, the molding material 28 may be filled into the gaps between die bonding structures 26. The molding material 28 may include a molding compound, a molding underfill, an epoxy, a resin, the like, or a combination thereof. The top surface of the molding material 28 is higher than the top ends of the die bonding structures 26 as deposited. Next, a curing step and a thinning step, which may be a grinding step or an etch step, are performed to thin the molding material 28, until the die bonding structures 26 are exposed.

Next, the conductive posts 30 are formed in the molding material 28. Throughout the description, the conductive posts 30 are alternatively referred to as through-package vias (TPVs) 30. The formation process of the TPVs 30 may include forming openings (occupied by TPVs 30) in the molding material 28 until the backside passivation layer 22 is exposed, and depositing the TPVs 30 in the openings. The material of the TPVs 30 may include copper, aluminum, tungsten, nickel, the like, or a combination thereof. In some embodiments, the TPVs 30 are formed by a plating process. As illustrated in FIG. 1, the bottom ends 30B of the TPVs 30 are substantially level with the bottom surface of dies 24. In some embodiments, a planarization is performed to level the top ends 30A of the TPVs 30 with the top ends of the die bonding structures 26, and with top surface 28A of molding material 28.

Next, redistribution lines (RDLs) 32 are formed over molding material 28 and coupled to die bonding structures 26 and TPVs 30. RDLs 32 may also interconnect die bonding structures 26 and TPVs 30. RDLs 32 are formed in dielectric layers 33. In some embodiments, RDLs 32 are formed by depositing metal layers, patterning the metal layers, and filling the gaps between RDLs 32 with dielectric layers 44. In alternative embodiments, RDLs 32 and dielectric layers 33 are formed using damascene processes. RDLs 32 may comprise a metal or a metal alloy including aluminum, copper, tungsten, the like, or a combination thereof.

The connectors 34 are formed over and electrically coupled to the RDLs 32. Hence the connectors 34 may be electrically coupled to the dies 24 and TPVs 30. In some embodiments, the connectors 34 are coupled to the RDLs 32 by under bump metallizations (UBMs) (not shown). The connectors 34 are illustrated as micro bumps in FIG. 1, however in other embodiments, the connectors 34 are solder balls, metal pillars, controlled collapse chip connection (C4) bumps, electroless nickel-electroless palladium-immersion gold technique (ENEPIG) formed bumps, or the like. The connectors 34 may include a conductive material such as solder, copper, aluminum, gold, nickel, silver, palladium, tin, the like, or a combination thereof. In an embodiment in which the connectors 34 are solder bumps, the connectors 34 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shape. In another embodiment, the connectors 34 are metal pillars (such as a copper pillars) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 34. The metal cap layer may include nickel, tin, tin-lead, gold, silver, palladium, indium, nickel-palladium-gold, nickel-gold, the like, or a combination thereof and may be formed by a plating process.

Figure 2:
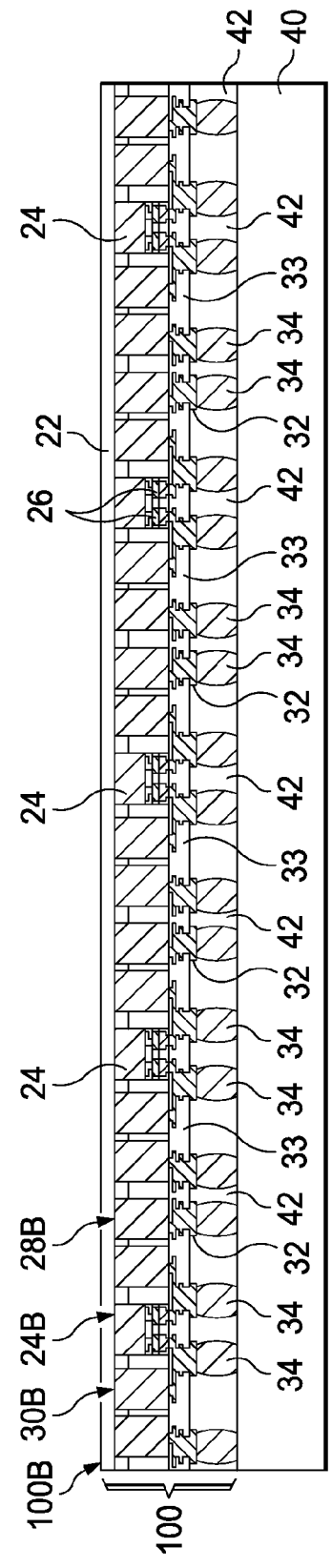

FIG. 2 illustrates a carrier switch. In the carrier switch process, carrier 40, as shown in FIG. 2, is first attached to the composite wafer 100, wherein carriers 40 and carrier 20 (FIG. 1) are on opposite sides of the composite wafer 100. The carrier 40 may be attached to the composite wafer 100 through adhesive 42, which may be a UV glue, a tape, or the like. The carrier 20 is then detached from the composite wafer 100. In this process, the composite wafer is flipped over with backside 100B being over the front side 100A of the composite wafer 100.

After the carrier switch, backside passivation layer 22 is exposed. In the illustrated structure, back ends 30B of TPVs 30 are level with back surface 24B of die 24 and back surface. Back ends 30B of TPVs 30 may also be substantially level with surface 28B of molding material 28. Furthermore, TPVs 30 are in contact with the bottom surface of backside passivation layer 22.

Figure 3:
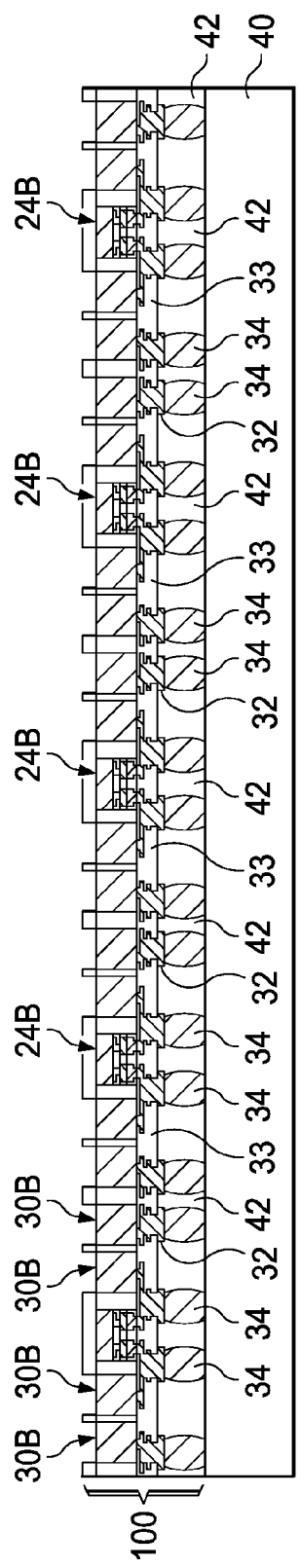

Next, as shown in FIG. 3, an etching process is performed to pattern the backside passivation layer 22 to expose the surfaces 30B of the TPVs 30. In an embodiment, the patterning process is performed by a laser drill process. In another embodiment, the patterning process may be performed by forming and patterning a photo resist (not shown) to expose portions of the backside passivation layer 22 and then etching the exposed portions of the backside passivation layer 22

Figure 4:
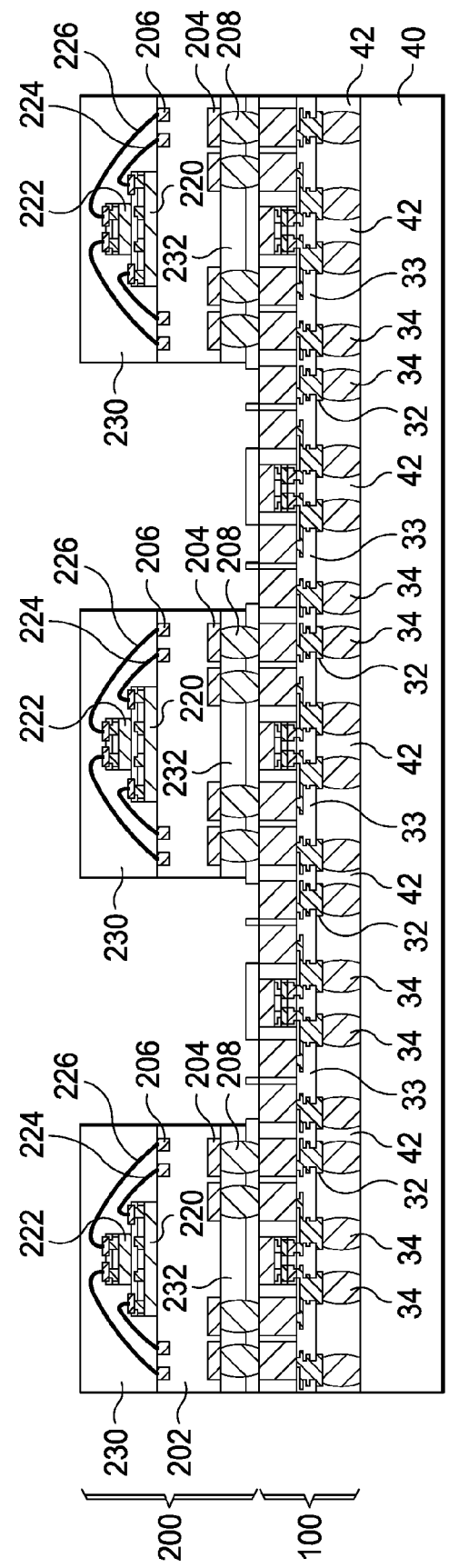

FIG. 4 illustrates the bonding of packages 200 to the composite wafer 100 (step 806). The packages 200 include a substrate 202, bond pads 204 and 206, connectors 208, dies 220 and 222, wire bonds 224 and 226, molding compound 230, and underfill 232. The substrates 202 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 112 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. In some embodiments, the substrates 202 are based on an insulating core such as a fiberglass reinforced resin core. One example core material is fiberglass resin such as FR4. Alternatives for the core material include bismaleimide-triazine (BT) resin, or alternatively, other PC board materials or films. Build up films such as Ajinomoto build-up film (ABF) or other laminates may be used for substrates 202.

The substrate 202 may include active and passive devices (not shown in FIG. 4). As one of ordinary skill in the art will recognize, a wide variety of devices such as transistors, capacitors, resistors, combinations of these, and the like may be used to generate the structural and functional requirements of the design for the packages 200. The devices may be formed using any suitable methods The substrate 202 may also include metallization layers (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like).

The bond pads 206 may electrically couple the subsequently bonded dies 220 and 222 to the metallization layers. The bond pads 204 may electrically couple the connectors 208 to the metallization layers which allow the composite wafer 100 to be electrically coupled to the package 200. In some embodiments, the bond pads 204 and 206 include a thin seed layer (not shown) deposited on the substrate 202, such as by physical vapor deposition (PVD), chemical vapor deposition (CVD), atomic layer deposition (ALD), the like, or a combination thereof. The seed layer may be made of copper, titanium, nickel, gold, the like, or a combination thereof. The conductive material of the bond pads 204 and 206 may be deposited over the thin seed layer. The conductive material may be formed by an electro-chemical plating process, CVD, ALD, PVD, the like, or a combination thereof. In an embodiment, the conductive material of the bond pads 204 and 206 is copper, tungsten, aluminum, silver, gold, the like, or a combination thereof. The connectors 208 may be formed by similar processes and similar materials as connectors 34 described above and the description will not be repeated herein, although the connectors 208 and 34 need not be the same.

In an embodiment the bond pads 204 and 206 are UBMs 204 and 206 and include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 204 and 206. Any suitable materials or layers of material that may be used for the UBMs 204 and 206 are fully intended to be included within the scope of the current application.

After the bond pads 206 are formed, the dies 220 and 222 are attached to the substrate 202 and coupled to the bond pads 206 by way of wire bonds 224 and 226, respectively. The dies 220 and 222 may be device dies having integrated circuit devices, such as transistors, capacitors, inductors, resistors (not shown), and the like, therein. Further, the dies 220 and 222 may be logic dies having core circuits, and may be, for example, a CPU die. In some embodiments, the dies 220 and 222 are a memory stacking.

A molding compound 230 may be formed over the dies 220 and 222, and wire bonds 224 and 226. The molding compound 230 may protect dies 220 and 222 and the wire bonds 224 and 226. The molding compound 230 may include a molding compound, a molding underfill, an epoxy, a resin, the like, or a combination thereof.

The bonding between the package 200 and the composite wafer 100 by way of bond pads 204, connectors 208, and TPVs 30 may be a solder bonding or a direct metal-to-metal (such as a copper-to-copper or tin-to-tin) bonding. In an embodiment, the connectors 208 are bonded to the TPVs 30 by a reflow process. During this reflow process, the connectors 208 are in contact with the TPVs 30 and the bond pads 204 to physically and electrically couple the package 200 and the composite wafer 100.

An underfill material 232 may be injected or otherwise formed in the space between the substrate 202 and the backside passivation layer 22. The underfill material 232 may, for example, be a liquid epoxy, deformable gel, silicon rubber, or the like, that is dispensed between the substrate 202 and the backside passivation layer 22, and then cured to harden. This underfill material 232 is used, among other things, to reduce cracking in and to protect the connectors 208. In some embodiments, the underfill material 232 may be formed after singulation of the packages 200 (see FIG. 7).

Although three packages 200 are illustrated in FIG. 4, there may be more than three packages 200 bonded to the composite wafer 100. For example, in FIG. 4, there may be an additional two packages 200 bonded to the composite wafer 100 in the spaces between packages 200.

Figure 5:
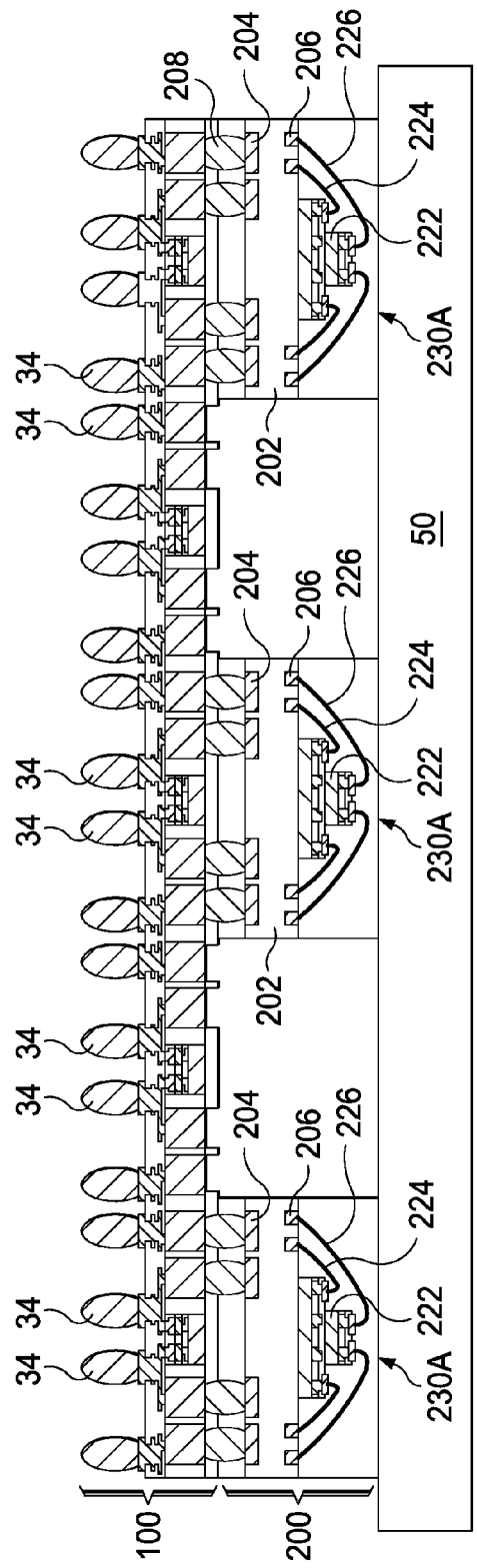

FIG. 5 illustrates the structure including packages 200 and composite wafer 100 being flipped over and placed on a dicing tape 50 such that top surfaces 230A of the molding compound 230 are in contact with the dicing tape 50. The carrier 40 has been demounted from the connectors 34 and the adhesive layer 42 has been removed.

FIG. 6 illustrates the singulation of the packages 200 and composite wafer 100 (step 808) to form package-on-composite-wafer structures 300. The composite wafer 100 may be sawed to singulate individual package structures 300, which include a composite wafer portion 150 and a package 200. As illustrated, the packages 200 and the composite wafer portions 150 have substantially same widths and are coterminous. In some embodiments, the package 200 has a smaller width than the composite wafer portion 150 and thus the packages 100 and 200 are not coterminous. The overall area of the package 200, when viewed from the top, may be smaller than or substantially equal to the overall area of the composite wafer portion 150.

FIG. 7 illustrates the mounting of the resulting package structure 300 to another package component 400 (step 810). The package component 400 may be an interposer, a package substrate, a printed circuit board (PCB), or the like. The package structure 300 may be electrically coupled to the package component 400 by the connectors 34. In some embodiments, the package structure 300 is mounted to the package component 400 by a reflow process. The composite wafer portion 150 has a thickness $T_1$, which, in some embodiments, is less than 100 µm.

Figure 9:
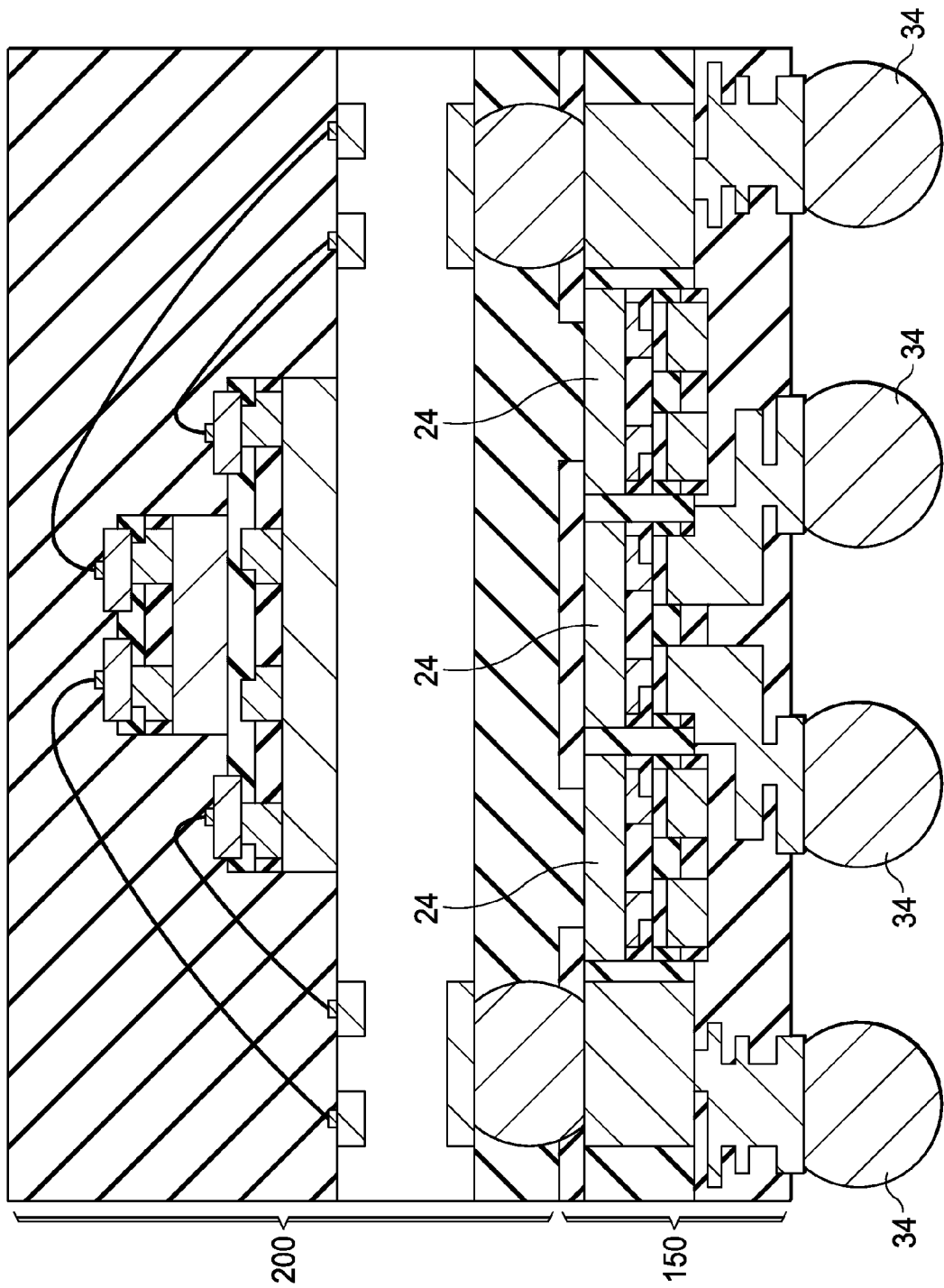
FIG. 9 illustrates a semiconductor device according to an embodiment.

FIG. 9 illustrates a semiconductor device according to an embodiment wherein the resulting package structure has more than one die 24 in the composite wafer portion 150. As illustrated, the composite wafer portion 150 includes three dies 24, although there may be more or less dies 24 as necessary. Details regarding this embodiment that are similar to those for the previously described embodiment and will not be repeated herein.

Figure 10:
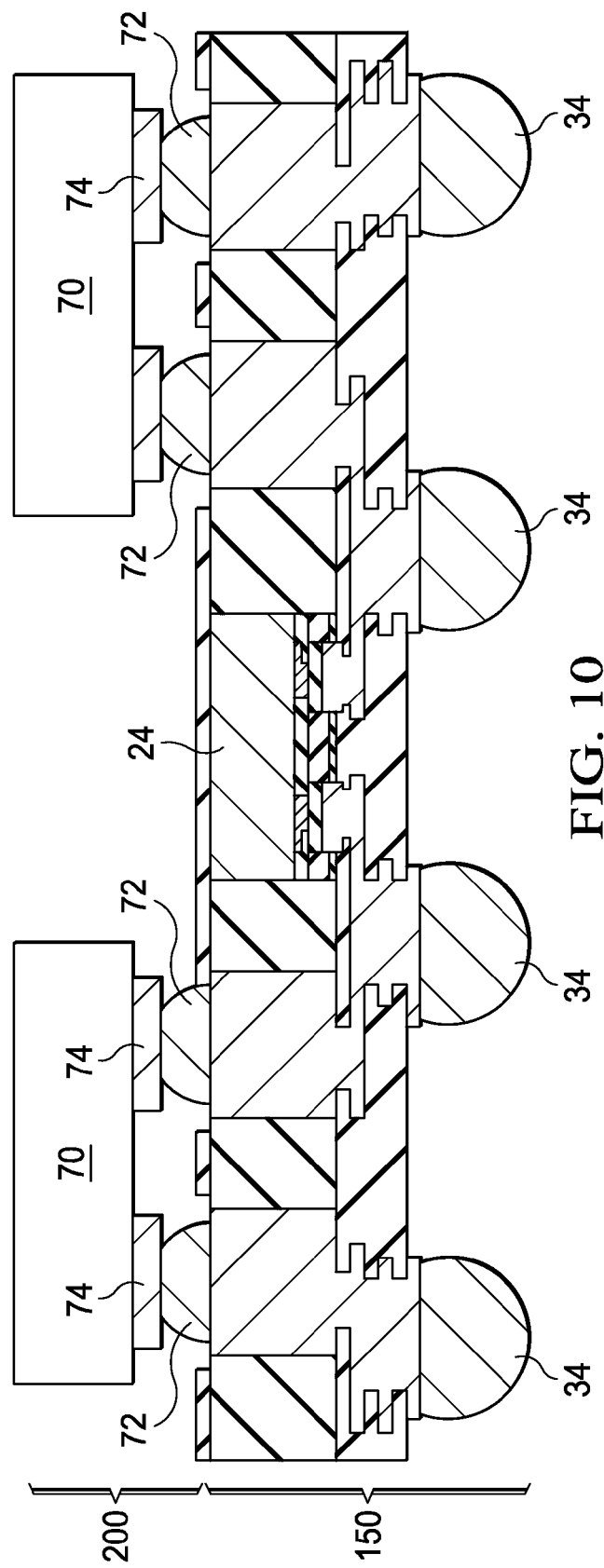
FIG. 10 illustrates a semiconductor device according to an embodiment.

FIG. 10 illustrates a semiconductor device according to an embodiment wherein the package 200 includes more than one package structure 70. The package structures 70 are bonded to the composite wafer portion 150 with bond pads 74 and connectors 72. In an embodiment, the package structures 70 are wafer level chip scale packages (WLCSPs) 70. The package structure 70 may be a fan-out wafer level package (FO-WLP), an embedded wafer level package (embedded WLP), a three-dimensional wafer level package (3D WLP), a wafer level MEMS (WLP MEMS), or the like. The package structure 70 may be any other WLP package developed in various other technologies and for various applications. Details regarding this embodiment that are similar to those for the previously described embodiment will not be repeated herein.

Figure 11:
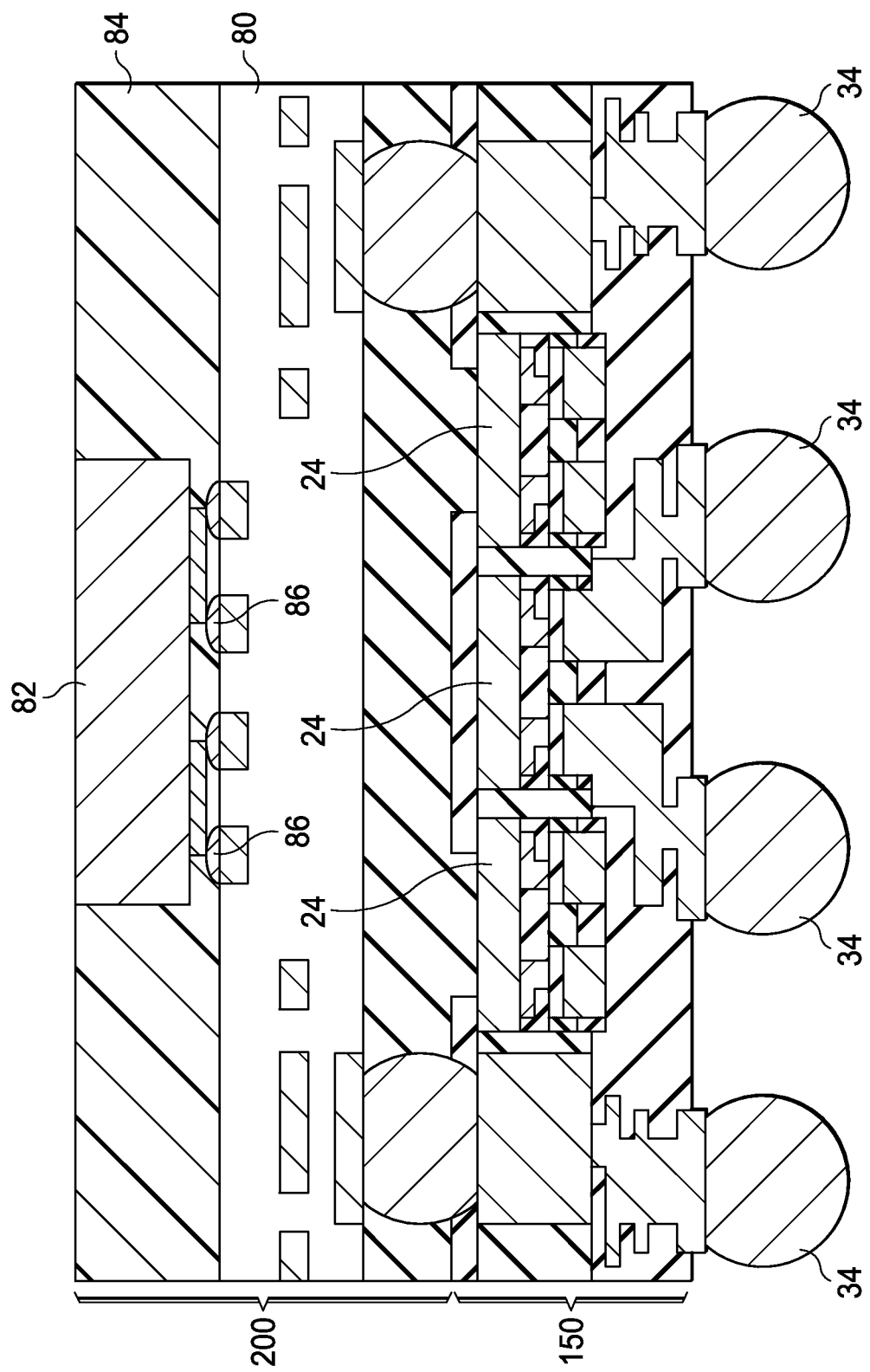
FIG. 11 illustrates a semiconductor device according to an embodiment.

FIG. 11 illustrates a semiconductor device according to an embodiment wherein the package 200 includes a die 82 bonded to a substrate 80 in a flip chip configuration by connectors 86. A molding compound 84 is surrounding and protecting the die 82. In an embodiment, the back surface of the die 82 may be substantially coplanar with the top surface of the molding compound 84. There may be an underfill between the die 82 and the substrate 80 surrounding the connectors 86. Details regarding this embodiment that are similar to those for the previously described embodiment will not be repeated herein.

By having a composite wafer portion as the bottom package component for the package structure, there is less warpage in the resulting package structure. Also, the composite wafer allows for further scaling down of the top package. The package structure allows a high volume with improved top package assembly yield. The top package assembly also allows for flexibility in the various structure types that may be bonded to the composite wafer.

An embodiment is a method including placing a plurality of dies over a passivation layer, the plurality of dies comprising at least one active device, molding the plurality of dies with a first molding material, and forming a plurality of through-package vias (TPVs) in the first molding material, first surfaces of the plurality of TPVs being substantially coplanar with a backside surfaces of the plurality of dies. The method further includes patterning the passivation layer to expose a portion of the first surfaces of the plurality of TPVs, and bonding a plurality of top packages to the first surfaces of the plurality of TPVs.

Another embodiment is a method including forming a composite wafer. The forming the composite wafer including forming a passivation layer over a first carrier, placing backside surfaces of a plurality of dies on the passivation layer, each of the plurality of dies having die bonding structures on an active surface of the die, the active surfaces being opposite the backside surfaces, molding the plurality of dies with a molding compound, forming a plurality of conductive posts in the molding compound, planarizing the plurality of conductive posts, the molding compound, and the die bonding structures, and forming a first set of connectors over the plurality of conductive posts and die bonding structures, each of the first set of connectors being coupled to at least one conductive post or die. The method further includes removing the composite wafer from first carrier, patterning the passivation layer to expose first surfaces of the conductive posts, and bonding a plurality of top packages to the exposed first surfaces of the conductive posts with a second set of connectors.

A further embodiment is a package including a composite wafer portion, the composite wafer portion including a first die, a molding material surrounding the first die, a top surface of the molding material being coplanar with a top surface of the first die, a first through-package via (TPV) extending through the molding material, the first TPV having a top surface coplanar with the top surface of the first die, and a first connector contacting the top surface of the first TPV. The package further includes a top package coupled to the first connector, the top package comprising at least one active device.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and operations described in the specification. As one of ordinary skill in the art will readily appreciate from the disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A method comprising:
   forming a plurality of bottom packages comprising:
      forming a passivation layer over a first carrier;
      placing backside surfaces of a plurality of dies on the passivation layer, each of the plurality of dies having die connectors on an active surface of the die, the active surfaces being opposite the backside surfaces;
      molding the plurality of dies with a molding compound;
      forming a plurality of through vias in the molding compound;
      forming redistribution lines (RDLs) over and electrically coupled to the plurality of through vias and the die connectors; and
      forming a first set of conductive connectors over and coupled to the RDLs;
   removing the plurality of bottom packages from first carrier;
   patterning the passivation layer to expose first surfaces of the through vias;
   bonding a plurality of top packages to the exposed first surfaces of the through vias with a second set of conductive connectors;
   placing the plurality of bottom packages and the plurality of top packages on a dicing tape; and
   sawing the plurality of bottom packages and the plurality of top packages to form a plurality of semiconductor packages.

2. The method of claim 1, wherein the plurality of top packages contacts the dicing tape.

3. The method of claim 1 further comprising:
   planarizing the plurality of through vias, the molding compound, and the die connectors to have substantially coplanar surfaces.

4. The method of claim 1, wherein at least two of the plurality of top packages comprises at least two wafer level chip scale packages.

5. The method of claim 1 further comprising:
   before the patterning the passivation layer, attaching the first set of conductive connectors of the plurality of bottom packages to a second carrier with an adhesive layer; and
   after the bonding the plurality of top packages, removing the second carrier.

6. The method of claim 1 further comprising:
   mounting at least one of the plurality of semiconductor packages to another package component using the first set of conductive connectors.

7. A method comprising:
   placing a plurality of dies over a passivation layer, the plurality of dies comprising at least one active device;
   molding the plurality of dies with a first molding material;
   forming a plurality of through-package vias (TPVs) in the first molding material, first surfaces of the plurality of TPVs being substantially coplanar with a backside surfaces of the plurality of dies;
   patterning the passivation layer to expose a portion of the first surfaces of the plurality of TPVs; and
   bonding a plurality of top packages to the first surfaces of the plurality of TPVs.

8. The method of claim 7 further comprising:
   forming redistribution lines over and electrically coupled to the plurality of TPVs;
   forming a plurality of connectors on the redistribution lines; and
   bonding the plurality of connectors to a printed circuit board.

9. The method of claim 7 further comprising:
   before bonding the plurality of top packages, forming the plurality of top packages comprising:
      mounting at least two dies to a substrate;

coupling the at least two dies to the substrate with wire bonds; and molding the at least two dies and the wire bonds with a second molding material.

10. The method of claim 7, wherein at least two of the plurality of top packages comprises at least two wafer level chip scale packages.

11. The method of claim 7, wherein a surface of the first molding material is substantially coplanar with first surfaces of the plurality of TPVs and backside surfaces of the plurality of dies.

12. The method of claim 7 further comprising sawing the plurality of dies and the plurality of top packages to form a plurality of semiconductor devices.

13. The method of claim 12, wherein before sawing the plurality of dies and the plurality of top packages, placing the plurality of dies and the plurality of top packages on a dicing tape.

14. A method comprising:
forming a composite wafer comprising:
  forming a passivation layer over a first carrier;
  placing backside surfaces of a plurality of dies on the passivation layer, each of the plurality of dies having die bonding structures on an active surface of the die, the active surfaces being opposite the backside surfaces;
  molding the plurality of dies with a molding compound;
  forming a plurality of conductive posts in the molding compound;
  planarizing the plurality of conductive posts, the molding compound, and the die bonding structures; and
  forming a first set of connectors over the plurality of conductive posts and die bonding structures, each of the first set of connectors being coupled to at least one conductive post or die;
removing the composite wafer from first carrier;
patterning the passivation layer to expose first surfaces of the conductive posts; and
bonding a plurality of top packages to the exposed first surfaces of the conductive posts with a second set of connectors.

15. The method of claim 14 further comprising:
before the patterning the passivation layer, attaching the first set of connectors of the composite wafer to a second carrier with an adhesive layer; and
after the bonding the plurality of top packages, removing the second carrier.

16. The method of claim 14, wherein the forming the composite wafer further comprises:
forming redistribution lines (RDLs) over and electrically coupled to the plurality of conductive posts and the die bonding structures, the first set of connectors being coupled to the RDLs.

17. The method of claim 14, further comprising:
before bonding the plurality of top packages, forming the plurality of top packages comprising:
  mounting at least two dies to a first side of a substrate;
  forming the second set of connectors on a second side of the substrate, the second side being opposite the first side; and
  coupling the at least two dies to the second set of connectors.

18. The method of claim 14, wherein after the planarizing the plurality of conductive posts, the molding compound, and the die bonding structures, surfaces of the conductive posts, the molding compound, and the die bonding structures are substantially coplanar.

19. The method of claim 14 further comprising:
after the bonding the plurality of top packages, placing the composite wafer and the plurality of top packages on a dicing tape, the plurality of top packages contacting the dicing tape; and
sawing the composite wafer and the plurality of top packages to form a plurality of semiconductor packages.

20. The method of claim 19, wherein each of the plurality of semiconductor packages comprise:
at least one of the plurality of dies;
at least one the plurality of conductive posts;
at least one the first set of connectors;
at least one of the second set of connectors; and
at least one of the plurality of top packages.

* * * * *